United States Patent
Yoon et al.

(10) Patent No.: US 9,117,536 B2
(45) Date of Patent: Aug. 25, 2015

(54) METHOD FOR OPERATING NON-VOLATILE MEMORY DEVICE AND MEMORY CONTROLLER

(71) Applicant: SAMSUNG ELECTRONICS CO., LTD., Suwon-Si, Gyeonggi-Do (KR)

(72) Inventors: Hyun Jun Yoon, Seongnam-si (KR); Jaeyong Jeong, Yongin-si (KR); Myung-Hoon Choi, Suwon-si (KR); Kitae Park, Seongnam-si (KR)

(73) Assignee: Samsung Electronics Co., Ltd., Suwon-si, Gyeoggi-do (KR)

( * ) Notice: Subject to any disclaimer, the term of this patent is extended or adjusted under 35 U.S.C. 154(b) by 0 days.

(21) Appl. No.: 14/088,511

(22) Filed: Nov. 25, 2013

(65) Prior Publication Data

US 2014/0153330 A1    Jun. 5, 2014

(30) Foreign Application Priority Data

Dec. 5, 2012    (KR) .......................... 10-2012-0140380

(51) Int. Cl.
   *G11C 11/34*   (2006.01)
   *G11C 16/26*   (2006.01)
   *G11C 11/56*   (2006.01)
   *G11C 16/04*   (2006.01)
   *G11C 16/34*   (2006.01)

(52) U.S. Cl.
   CPC ............ *G11C 16/26* (2013.01); *G11C 11/5642* (2013.01); *G11C 16/0483* (2013.01); *G11C 16/3404* (2013.01); *G11C 16/3422* (2013.01)

(58) Field of Classification Search
   CPC .......................... G11C 16/10; G11C 16/0483
   USPC ........................................ 365/185.03, 185.24
   See application file for complete search history.

(56) References Cited

U.S. PATENT DOCUMENTS

| | | | |
|---|---|---|---|
| 6,992,932 B2 * | 1/2006 | Cohen | 365/185.2 |
| 7,738,293 B2 * | 6/2010 | Cho et al. | 365/185.03 |
| 7,898,865 B2 * | 3/2011 | Baek et al. | 365/185.2 |
| 7,936,601 B2 | 5/2011 | Kang et al. | |
| 8,068,360 B2 | 11/2011 | Anholt | |
| 8,116,141 B2 | 2/2012 | Yoo et al. | |
| 8,422,291 B2 | 4/2013 | Kim et al. | |
| 2008/0192544 A1 | 8/2008 | Berman et al. | |
| 2011/0066899 A1 | 3/2011 | Kang et al. | |

\* cited by examiner

*Primary Examiner* — Michael Tran
(74) *Attorney, Agent, or Firm* — Volentine & Whitt, PLLC

(57) ABSTRACT

An operating method for a non-volatile memory device includes applying first and second read voltages to a first word line to perform a read operation; counting first memory cells each having a threshold voltage belonging to a first voltage range between the first read voltage and the second read voltage; applying a third read voltage to the first word line sequentially after applying the second read voltage to count second memory cells each having a second threshold voltage belonging to a voltage range between the second read voltage and the third read voltage; comparing the number of first memory cells counted and the number of second memory cells counted; determining a fourth read voltage based on a result of the comparing; and applying the fourth read voltage to the first word line sequentially after applying the third read voltage.

18 Claims, 17 Drawing Sheets

METHOD FOR OPERATING NON-VOLATILE MEMORY DEVICE AND MEMORY CONTROLLER

CROSS-REFERENCE TO RELATED APPLICATIONS

A claim for priority under 35 U.S.C. §119 is made to Korean Patent Application No. 10-2012-0140380 filed Dec. 12, 2012, in the Korean Intellectual Property Office, the entire contents of which are hereby incorporated by reference.

BACKGROUND

The inventive concepts described herein relate to a semiconductor memory device, and more particularly, relate to an operating method of a non-volatile memory device and an operating method of a memory controller.

In general, a memory device may be volatile or non-volatile. A volatile memory device may lose data stored therein at power-off. A non-volatile memory device may retain data stored therein even at power-off. Examples of non-volatile memory devices include a read only memory (ROM), an electrically erasable programmable ROM (EEPROM), or the like.

A flash memory device introduced to be a flash EEPROM may be different from a conventional EEPROM in terms of their structures and operations. The flash memory device may perform an electric erase operation by a block unit and a program operation by a bit unit.

Threshold voltages of programmed memory cells in the flash memory device may vary due to various causes (e.g., floating gate coupling, charge loss with the lapse of time, etc.). A variation in threshold voltages of memory cells may reduce of the reliability of read data.

SUMMARY

One aspect of embodiments of the inventive concept is directed to provide a method of operating a non-volatile memory device which comprises employing a voltage generator to apply first and second read voltages to a first word line of the memory device to perform a read operation; counting first memory cells of the memory device each having a threshold voltage belonging to a first voltage range between the first read voltage and the second read voltage; employing the voltage generator to apply a third read voltage to the first word line sequentially after applying the second read voltage to count second memory cells of the memory device each having a threshold voltage belonging to a second voltage range between the second read voltage and the third read voltage; comparing the number of first memory cells counted and the number of second memory cells counted; determining a fourth read voltage based on a result of the comparing; and employing the voltage generator to apply the fourth read voltage to the first word line sequentially after applying the third read voltage.

Another aspect of embodiments of the inventive concept is directed to provide a method of controlling a memory device which comprises counting first memory cells of the memory device each having a threshold voltage belonging to a first voltage range between a first read voltage and a second read voltage; counting second memory cells of the memory device each having a threshold voltage belonging to a second voltage range between the second read voltage and a third read voltage; comparing the number of first memory cells counted; and the number of second memory cells counted; and a read voltage adjusting unit determining a fourth read voltage to be applied to the memory cells sequentially after the third read voltage.

Yet another aspect of embodiments of the inventive concept is directed to a method comprising: counting first memory cells of a memory device each having a threshold voltage belonging to a first voltage range between a first read voltage and a second read voltage; counting second memory cells of the memory device each having a threshold voltage belonging to a second voltage range between the second read voltage and the third read voltage; comparing the number of first memory cells counted and the number of second memory cells counted to produce a comparison result; and a read voltage level adjusting unit determining, based on the comparison result, a third voltage range for counting memory cells of the memory device having a threshold voltage belonging to the third voltage range.

With embodiments of the inventive concept, it is possible to search a valley of a threshold voltage distribution where an bit error rate or ratio is minimal and to improve the probability of ECC error correction.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1A:
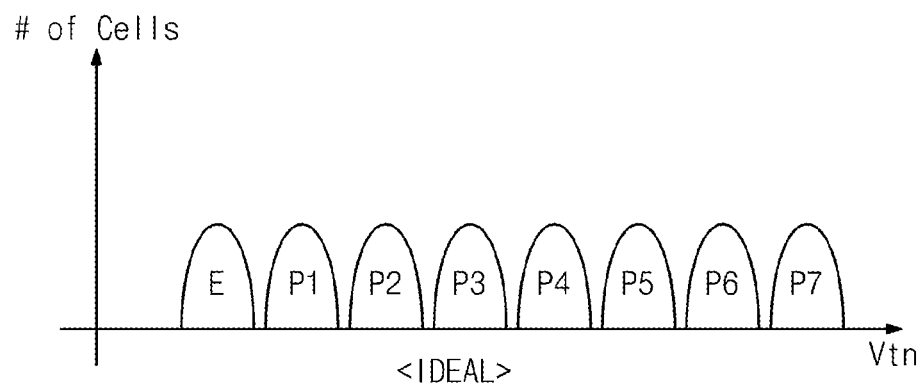
FIG. 1A is a diagram schematically illustrating threshold voltage distributions corresponding to program and erase states after programming of a multi-level cell (3-bit MLC) flash memory device.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1A is a diagram schematically illustrating threshold voltage distributions corresponding to program and erase states after programming of a multi-level cell (3-bit MLC) flash memory device. In an MLC flash memory where k-bit data is programmed at a memory cell, the memory cell may have one of $2^k$ threshold voltage distributions.

Threshold voltages of memory cells programmed with the same data may form a particular range of threshold voltage distribution due to a characteristic difference between memory cells. The threshold voltage distributions may correspond to $2^k$ data values which are generated by k data bits. In a 3-bit MLC, as illustrated in FIG. 1A, threshold voltage distributions corresponding to seven program states P1 to P7 and a threshold voltage distribution corresponding to an erase state may be formed. FIG. 1A shows such an ideal case wherein the threshold voltage distributions each having a range of read voltage margin do not overlap.

Figure 1B:
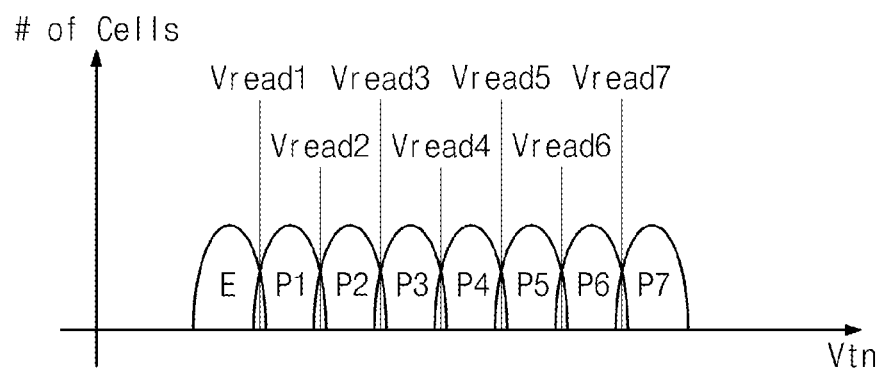
FIG. 1B is a diagram schematically illustrating threshold voltage distributions of program and erase states varied due to characteristic deterioration of flash memory cells when a 3-bit MLC flash memory is programmed and then experiences iterative program and read operations.

FIG. 1B is a diagram schematically illustrating threshold voltage distributions of program and erase states varied due to characteristic deterioration of flash memory cells when a 3-bit MLC flash memory is programmed and then experiences iterative program and read operations.

A flash memory may experience such a phenomenon that electrons trapped at a floating gate or tunnel oxide film are discharged over time. This may be referred to as charge loss. The charge loss may be accelerated when the tunnel oxide film is deteriorated by iterative program and erase operations. The charge loss may make a threshold voltage of a memory cell decrease. For example, a threshold voltage distribution may be shifted to the left in FIG. 1B.

The program disturbance, erase disturbance and/or back pattern dependency phenomenon may cause an increase in threshold voltages. As characteristics of memory cells are deteriorated by the above-described causes, threshold voltage distributions of adjacent states may overlap as illustrated in FIG. 1B.

If a particular when a read voltage is applied to a selected word line under a condition where threshold voltage distributions overlap, the read data may include a lot of errors. For example, if a state of a memory cell sensed when a read voltage Vread3 is applied to a selected word line is an ON state, the ON state may indicate read data existing at a state S2. If a state of a memory cell sensed when the read voltage Vread3 is applied to the selected word line is an OFF state, the OFF state may indicate read data existing AT a state S3. In a case where threshold voltage distributions overlap, however, a memory cell which should be read as an OFF state may be read as an ON state. Thus, if threshold voltage distributions overlap, the read data may include a lot of errors.

Figure 2:
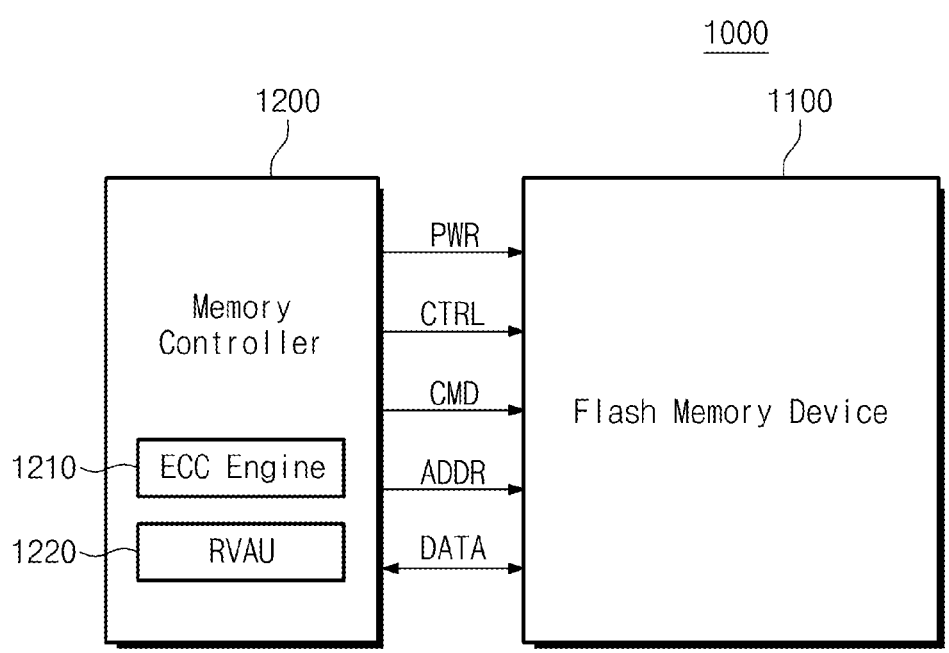
FIG. 2 is a block diagram schematically illustrating a flash memory system according to an embodiment of the inventive concept.

FIG. 2 is a block diagram schematically illustrating a flash memory system according to an embodiment of the inventive concept. Referring to FIG. 2, a flash memory system 1000 may include a flash memory device 1100 and a memory controller 1200. Flash memory system 1000 may include all flash memory based data storage media such as a memory card, a USB memory, a solid state drive (SSD), and so on.

Flash memory device 1100 may perform an erase, write or read operation according to a control of memory controller 1200. Flash memory device 1100 may receive a command CMD, an address ADDR and data DATA through input/output lines. Flash memory device 1100 may receive a power PWR through a power line and a control signal CTRL through a control line. The control signal may include a command latch enable (CLE) signal, an address latch enable (ALE) signal, a chip enable (nCE) signal, a write enable (nWE) signal, a read enable (nRE) signal, and so on.

Memory controller 1200 may control an overall operation of flash memory device 1100. Memory controller 1200 may include an ECC engine 1210 for correcting bit errors and a read voltage level adjusting unit (RVAU) 1220.

ECC engine 1210 may perform bit error correction on data. ECC engine 1210 may perform error correction encoding on data to be programmed into flash memory device 1100 to form data to which parity bits are added. The parity bits may be stored at flash memory device 1100.

ECC engine 1210 may perform error correction decoding on data read from flash memory device 1100. ECC engine 1210 may determine whether the error correction decoding is successful, and may output an instruction signal according to the determination result. ECC engine 1210 may correct bit errors of data using parity bits generated during ECC encoding.

If the number of bit errors exceeds a correctable bit error limit, ECC engine 1210 may not correct bit errors. In this case, ECC engine 1210 may generate an error correction fail signal.

ECC engine 1210 may correct an error using a low density parity check (LDPC) code, a BCH code, a turbo code, a Reed-Solomon code (RS), a convolution code, a Recursive Systematic Code (RSC), or coded modulation such as Trellis-Coded Modulation (TCM), Block Coded Modulation (BCM), and so on. However, the inventive concept is not limited thereto. ECC engine 1210 may include an error correction circuit, an error correction system, and an error correction device.

As described above, when the number of bit errors exceeds a correctable bit error limit, ECC engine 1210 may generate an error correction fail signal. With embodiments of the inventive concept, ECC engine 1210 may again perform a read operation when a data read operation using a first read voltage fails.

In other words, under control of memory controller 1200, flash memory device 1100 may again read data using a second read voltage less than the first read voltage. ECC engine 1210 may make it possible to iteratively perform a read operation of flash memory device 1100 until error correction of read data is successfully performed.

Read voltage level adjusting unit 1220 may comprise logic circuitry, firmware, a processor programmed with software to execute one or more routines, or any combination of the above. Read voltage level adjusting unit 1220 may count first memory cells each having a threshold voltage belonging to a first voltage range between a first read voltage and a second read voltage of flash memory device 1100. Read voltage level adjusting unit 1220 may count second memory cells each having a threshold voltage belonging to a second voltage range between the second read voltage and a third read voltage sequentially applied following the second read voltage (for example, a third read voltage which is less than the second read voltage). Read voltage level adjusting unit 1220 may compare the number of first memory cells counted and the number of second memory cells counted.

For example, if bit error correction of ECC engine 1210 on data read using the first and second read voltages fails, memory controller 1200 may control flash memory device 1100 such that a read operation on a selected word line is again performed with a third read voltage following the second read voltage being applied thereto.

Read voltage level adjusting unit 1220 may determine a fourth read voltage to be applied sequentially following the third read voltage according to the comparison result of the first and second memory cell counts. If the number of second memory cells is less than the number of first memory cells, read voltage level adjusting unit 1220 may determine the fourth read voltage to be less than the third read voltage. If the fourth read voltage is less than the third read voltage, a fifth read voltage to be applied after the fourth read voltage may be determined to be less than the fourth read voltage. If the number of second memory cells is more than the number of first memory cells, read voltage level adjusting unit 1220 may determine the fourth read voltage to be greater than the third read voltage.

If bit error correction of ECC engine 1210 on data read using the fourth read voltage fails, memory controller 1200 may control flash memory device 1100 such that a read operation on a selected word line is again performed with the fifth read voltage following the fourth read voltage being applied thereto. For example, if the fourth read voltage is greater than the third read voltage, read voltage level adjusting unit 1220 may determine the fifth read voltage to be applied following the fourth read voltage to be greater than or less than the fourth read voltage. Likewise, a sixth read voltage to be applied following the fifth read voltage may be greater than or less than the fifth read voltage.

ECC engine 1210 may make it possible to iteratively perform a read operation of flash memory device 1100 until error correction of read data is successfully performed.

Figure 3:
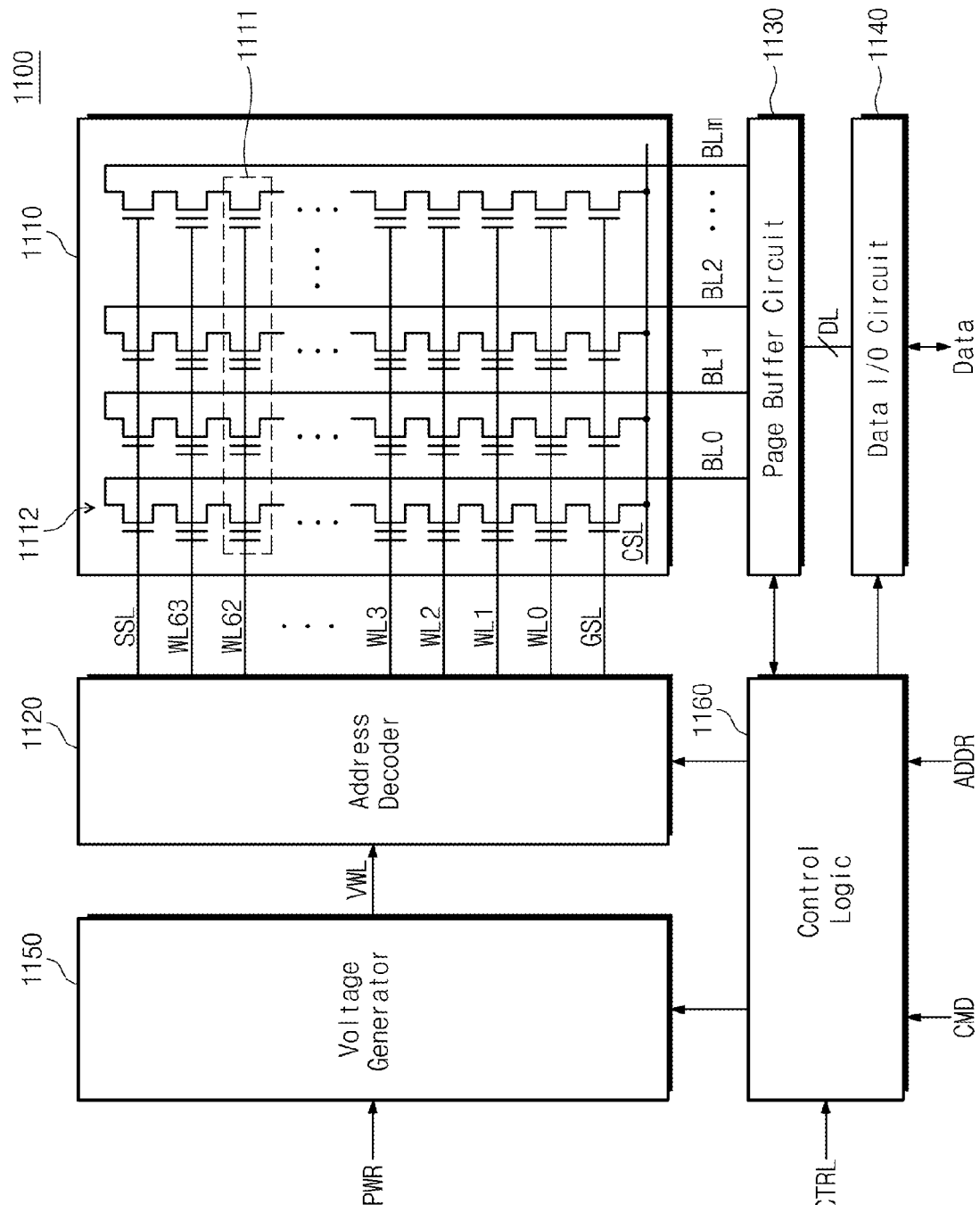
FIG. 3 is a block diagram schematically illustrating a flash memory device illustrated in FIG. 2.

FIG. 3 is a block diagram schematically illustrating a flash memory device illustrated in FIG. 2. Referring to FIG. 3, a flash memory device 1100 may include a memory cell array 1110, an address decoder 1120, a page buffer circuit 1130, a data input/output circuit 1140, a voltage generator 1150, and control logic 1160.

In FIG. 3, there is illustrated an example in which memory cell array 1110 includes a memory block. However, memory cell array 1110 can include more memory blocks. A reference number "1111" may indicate a page. Respective pages may be formed of a plurality of memory cells. Each memory cell may be formed of a cell transistor having a control gate and a floating gate.

Memory cell array 1110 may include a plurality of cell strings 1112. Each cell string 1112 may include a string select transistor connected with a string select line SSL, a plurality of memory cells each connected with a plurality of word lines WL0 to WL63 and a ground select transistor connected with a ground select line GSL. In each cell string, a string select transistor may be connected with a bit line and a ground select transistor may be connected with a common source line CSL.

A memory cell may store one data bit or two or more data bits. A memory cell storing one data bit may be referred to as a single level cell (SLC) or a single bit cell. A memory cell storing two or more data bits may be referred to as a multi-level cell (MLC) or a multi-bit cell.

In a 2-bit MLC flash memory device, two logical pages may be stored at a physical page. Here, a logical page may indicate a set of data bits to be programmed at a physical page at the same time. In a 3-bit MLC flash memory device, three logical pages may be stored at a physical page.

Referring to FIG. 3, address decoder 1120 may be connected with memory cell array 1110 through the select lines SSL and GSL and the word lines WL0 to WL63. For a data read operation, address decoder 1120 may select a word line (e.g., WL62) in response to an address ADDR.

Page buffer circuit 1130 may be connected with memory cell array 1110. Page buffer circuit 1130 may include a plurality of page buffers (not shown). A page buffer may be connected with a bit line. This structure may be referred to as the "all bit line structure." A page buffer may be connected with two or more bit lines. This structure may be referred to as the "shield bit line structure." Page buffer circuit 1130 may temporarily store data to be programmed at a selected page 1111 or data read from the selected page 1111.

Data input/output circuit 1140 may be connected to page buffer circuit 1130 through data lines DL and to a memory controller 1200 (refer to FIG. 2) through input/output lines I/O. Data input/output circuit 1140 may receive program data from memory controller 1200 at a program operation and provide read data to memory controller 1200 at a read operation.

Voltage generator 1150 may receive a power PWR from memory controller 1200 to generate a word line voltage needed to read or write data. The word line voltage may be provided to address decoder 1120.

Control logic 1160 may control reading, programming, and erasing of flash memory device 1100 using a command CMD, an address ADDR, and a control signal CTRL. For example, for a data programming operation, control logic 1160 may control address decoder 1120 such that a read voltage is applied to a selected word line and page buffer circuit 1130 and data input/output circuit 1140 such that data of a selected page 1111 is read.

A flash memory system 1000 (refer to FIG. 2) according to an embodiment of the inventive concept can be implemented such that control logic 1160 includes a read voltage level adjusting unit. In that case, the read voltage level adjusting unit of control logic 1160 may comprise logic circuitry, firmware, a processor programmed with software to execute one or more routines, or any combination of the above In this case, control logic 1160 may determine a fourth read voltage to be applied sequentially following a third read voltage by counting first memory cells each having a threshold voltage belonging to a voltage range between a first read voltage and a second read voltage, counting second memory cells each having a threshold voltage belonging to a voltage range between the second read voltage and the third read voltage, and comparing the number of first memory cells counted and the number of second memory cells counted.

Control logic 1160 may control voltage generator 1150 to provide the fourth read voltage thus determined to a selected word line. If the number of second memory cells is less than the number of first memory cells, control logic 1160 may determine the fourth read voltage to be less than the third read voltage. If the fourth read voltage is less than the third read voltage, a fifth read voltage applied after the fourth read voltage may be determined to be less than the fourth read voltage. If the fourth read voltage is greater than the third read voltage, control logic 1160 may determine a fifth read voltage to be applied following the fourth read voltage to be less than or greater than the fourth read voltage.

Flash memory system 1000 according to an embodiment of the inventive concept may perform a read retry operation. The read retry operation may be an operation of searching for a read voltage level having the smallest bit error rate or ratio of a threshold voltage distribution in FIG. 1B for a read failure. In a read retry operation, searching may be performed in a direction where a valley of a threshold voltage distribution exists. This may be to improve the error correction probability.

Flash memory system 1000 according to an embodiment of the inventive concept may can include a read voltage level adjusting unit 1220 in memory controller 1200 or in flash memory device 1100 to search for a valley of a threshold voltage distribution in a read retry operation.

Figure 4:
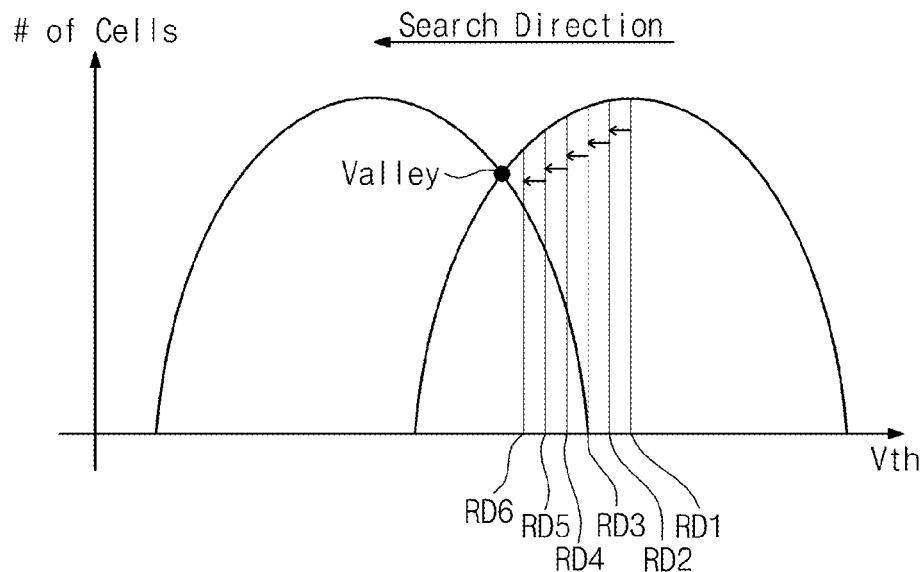
FIGS. 4 to 6 are diagrams schematically illustrating a read voltage level searching method of a flash memory system according to an embodiment of the inventive concept.
Figure 5:
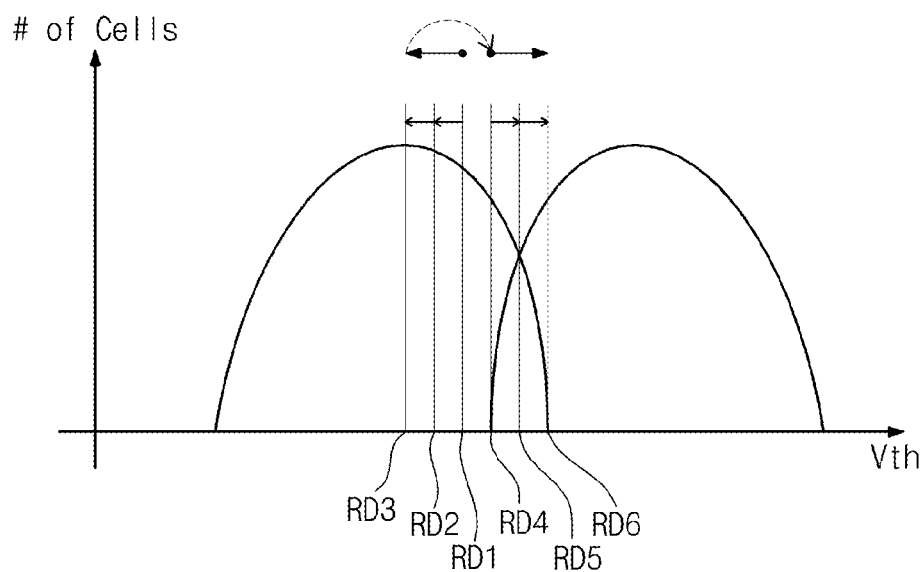
Figure 6:
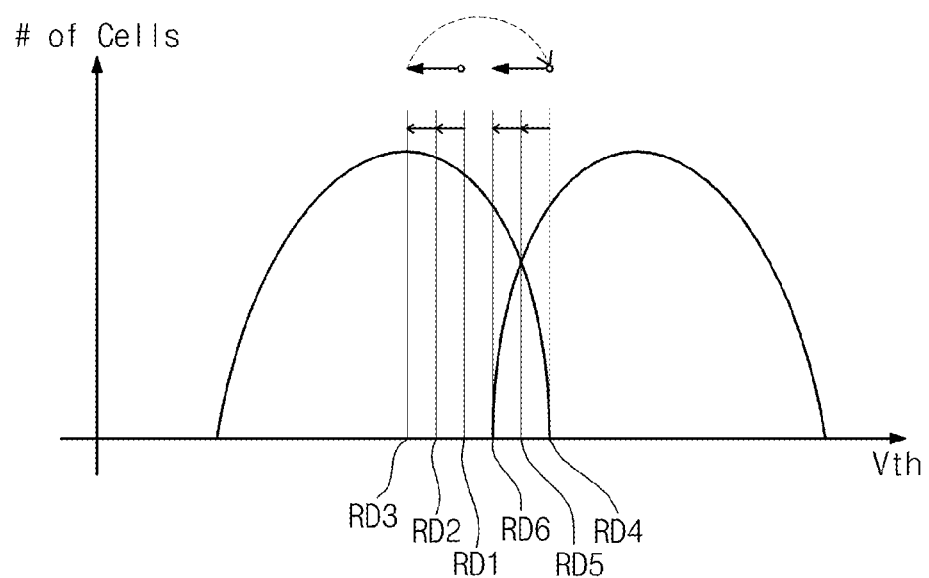

FIGS. 4 to 6 are diagrams schematically illustrating examples of read voltage level searching methods of a flash memory system according to an embodiment of the inventive concept. In FIGS. 4 to 6, the horizontal axis may indicate threshold voltages Vth of memory cells and the vertical axis may indicate the number of memory cells having the corresponding threshold voltage.

With a read voltage level searching method of FIG. 4, a read retry operation may be performed under a condition where a read voltage level gradually decreases. Referring to FIGS. 3 and 4, a flash memory device 1100 may determine a first read voltage RD1 as a search start level. Flash memory device 1100 may apply the first read voltage RD1 to a selected word line WLn−1 to perform a read operation. Flash memory device 1100 may apply a second read voltage RD2 less than the first read voltage RD1 to the selected word line WLn−1 to perform a read retry operation. Flash memory device 1100 may apply third to sixth read voltages RD3 to RD6 in the above-described manner to search for a valley of a threshold voltage distribution having a minimum bit error rate. In the example of FIG. 4, each of the read voltages which is applied is progressively less than the previously applied read voltage (i.e., RD6<RD5<RD4<RD3<RD2<RD1) However, in another example each of the read voltages which is applied is progressively greater than the previously applied read voltage.

For example, control logic 1160 may count first memory cells each having a threshold voltage belonging to a voltage range between a first read voltage and a second read voltage. Then, control logic 1160 may count second memory cells each having a threshold voltage belonging to a voltage range between the second read voltage and a third read voltage. The first memory cells may be counted by performing an XOR operation on results of read operations using the first and second read voltages. Likewise, the second memory cells may be counted by performing an XOR operation on results of read operations using the second and third read voltages.

Control logic 1160 may provide information associated with counts of the first and second memory cells to read voltage level adjusting unit 1220. Read voltage level adjusting unit 1220 may compare counts of the first and second memory cells to determine a fourth read voltage level to be applied sequentially following the third read voltage RD3. Read voltage level adjusting unit 1220 may provide the fourth read voltage level to the control logic 1160. Control logic 1160 may control a voltage generator 1150 such that the fourth read voltage RD4 is applied to a selected word line. Referring to FIG. 4, since the number of second memory cells is probabilistically less than the number of first memory cells, the fourth read voltage RD4 may be determined to be less than the third read voltage RD3.

An ECC engine 1210 may perform bit error correction on data read using the fourth read voltage RD4. If the bit error correction fails, flash memory device 1100 may apply a fifth read voltage RD5 less than the fourth read voltage RD4 to the selected word line. Likewise, flash memory device 1100 may apply a sixth read voltage RD6 less than the fifth read voltage RD5 to the selected word line. A memory controller 120 may control flash memory device 1100 such that a read retry operation is iterated until the bit error correction on read data is successfully performed. Meanwhile, a threshold voltage distribution of memory cells may be shifted due to various causes. In this case, since it is impossible to search for a valley of a threshold voltage distribution, read fail may be continuously generated. This may mean that the ECC correction probability is reduced.

A flash memory system 1000 according to another embodiment of the inventive concept may be configured to change a search direction and a search start voltage for searching for a valley of a threshold voltage distribution in a read retry operation. Read voltage level adjusting unit 1220 may adjust a search direction and a search start voltage.

In FIG. 5, there is illustrated a read voltage level searching method in which a search direction and a search start voltage are changed at a read retry operation.

Referring to FIG. 5, a read retry operation may be performed in a direction from a first read voltage RD1 to a third read voltage RD3. In this case, if the number of memory cells is determined to be continuously increased, flash memory system 1000 may change a search direction and set a search start level to a fourth read voltage RD4 greater than the first read voltage RD1.

A read retry operation may be performed in a direction from a fourth read voltage RD4 to a sixth read voltage RD6, that is, in an opposite direction. The fifth read voltage RD5 may be greater than the fourth read voltage RD4, and the sixth read voltage RD6 may be greater than the fifth read voltage RD5. The ECC error correction probability of flash memory system 1000 may be improved by searching for a valley of a threshold voltage distribution having a minimum bit error rate or ratio.

In FIG. 6, there is illustrated a read voltage level searching method in which a search start voltage is changed in a read retry operation.

Referring to FIG. 6, a read retry operation may be performed in a direction from a first read voltage RD1 to a third read voltage RD3. In this case, if the number of memory cells is determined to be continuously increased, flash memory system 1000 may change a search direction and set a search start level to a fourth read voltage RD4 greater than the first read voltage RD1.

Then, a read retry operation may be performed in the same direction as that of the first to third read voltages RD1 to RD3. The fifth read voltage RD5 may be less than the fourth read voltage RD4, and the sixth read voltage RD6 may be less than the fifth read voltage RD5. The ECC error correction probability of flash memory system 1000 may be improved by searching a valley of a threshold voltage distribution having a minimum bit error rate or ratio.

Figure 7:
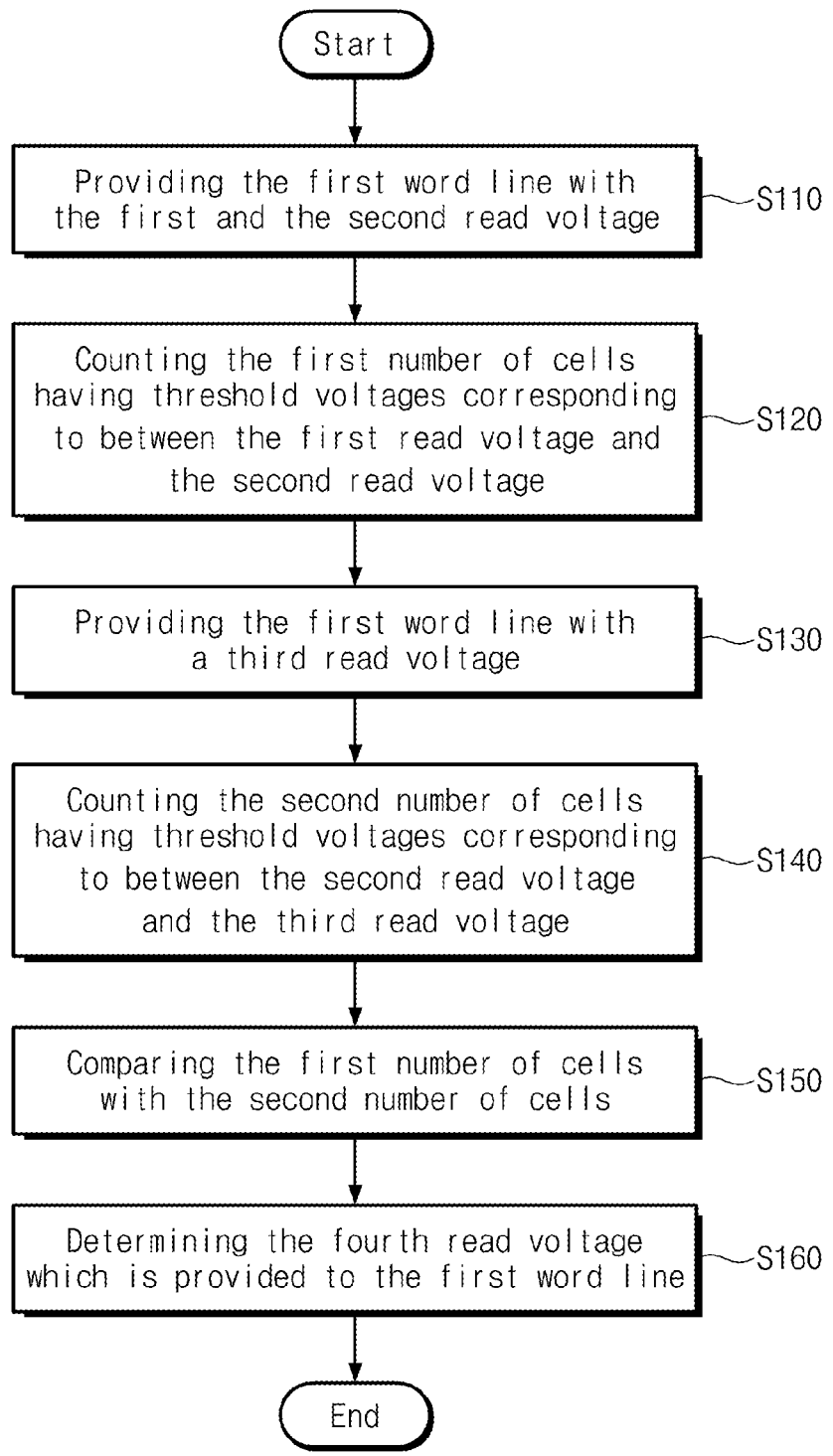
FIG. 7 is a flow chart schematically illustrating a read voltage level search method of a flash memory system according to an embodiment of the inventive concept.

FIG. 7 is a flow chart schematically illustrating a read voltage level search method of a flash memory system according to an embodiment of the inventive concept.

A memory controller 1200 (refer to FIG. 2) may read data from a flash memory device 1100 (refer to FIG. 2) and correct an error of the read data. If an error of the read data is uncorrectable, memory controller 1200 may control flash memory device 1100 to change a read voltage and perform a read retry operation using the changed read voltage. Flash memory device 1100 may perform a plurality of read retry operations to search a read voltage where the number of memory cells is minimal.

Referring to FIG. 7, flash memory device 1100 may apply first and second read voltages to a first word line (S110) and count first memory cells each having a threshold voltage belonging to a voltage range between the first read voltage and the second read voltage (S120). Flash memory device 1100 may apply a third read voltage following the second read voltage to the first word line (S130) and count second memory cells each having a threshold voltage belonging to a voltage range between the second read voltage and the third read voltage (S140). Flash memory device 1100 may compare counts of the first and second memory cells (S150) and determine a fourth read voltage to be applied to the first read voltage (S160).

For example, if the number of second memory cells is less than the number of first memory cells, the fourth read voltage may be determined to be less than the third read voltage. On the other hand, if the number of second memory cells is more than the number of first memory cells, the fourth read voltage may be determined to be greater than the third read voltage. With the above description, the ECC error correction probability of flash memory system 1000 may be improved by searching a valley of a threshold voltage distribution having a minimum bit error rate or ratio.

Figure 8:
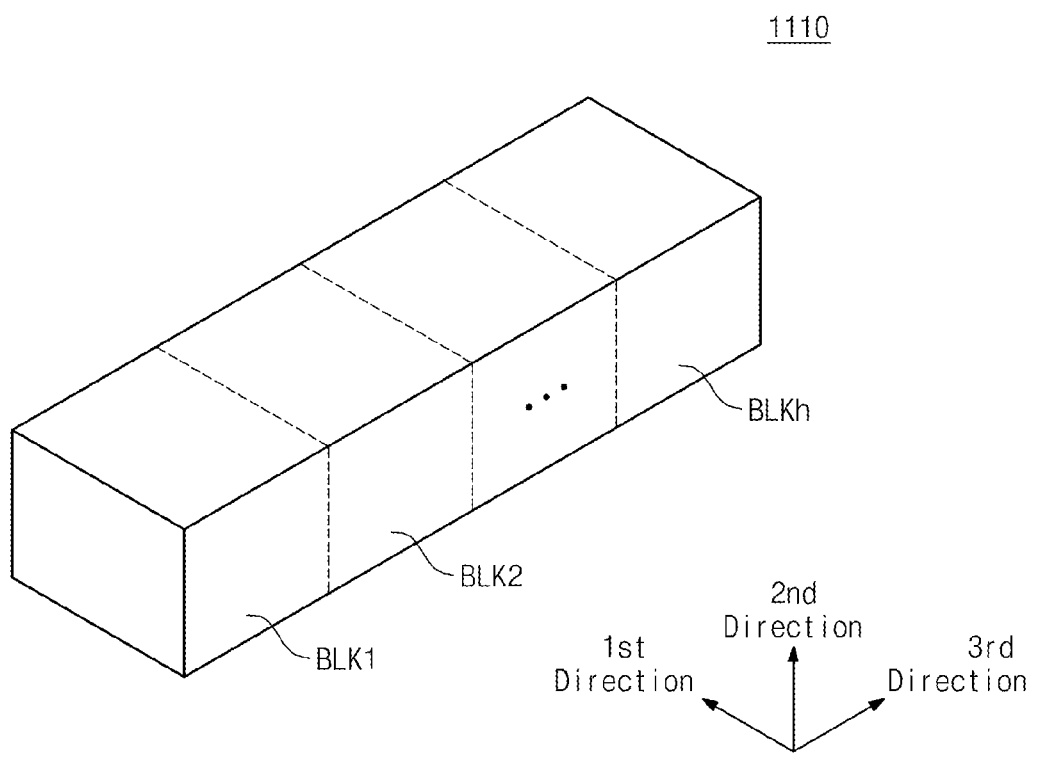
FIGS. 8 to 12 are diagrams schematically illustrating a three-dimensional flash memory device according to the inventive concept.

FIGS. 8 to 12 are diagrams schematically illustrating a three-dimensional flash memory device according to the inventive concept. FIG. 8 is a block diagram of memory cell array 1110 of FIG. 3. Referring to FIG. 8, memory cell array 1110 may include a plurality of memory blocks BLK1 to BLKh. Each of the memory blocks BLK1 to BLKh may have a three dimensional structure (or, a vertical structure). For example, each memory block may include structures extending along first to third directions.

Each memory block may include a plurality of NAND strings NS extending along the second direction. A plurality of NAND strings NS may be provided along the first and third directions. Each NAND string NS may be connected to a bit line BL, at least one string select line SSL, at least one ground select line GSL, a plurality of word lines WL, at least one dummy word line DWL, and a common source line CSL. Each of the memory blocks BLK1 to BLKh may be connected to a plurality of bit lines BL, a plurality of string select lines SSL, a plurality of ground select lines GSL, a plurality of word lines WL, a plurality of dummy word lines DWL, and a plurality of common source lines CSL. The memory blocks BLK1 to BLKh will be more fully described with reference to FIG. 9.

Figure 9:
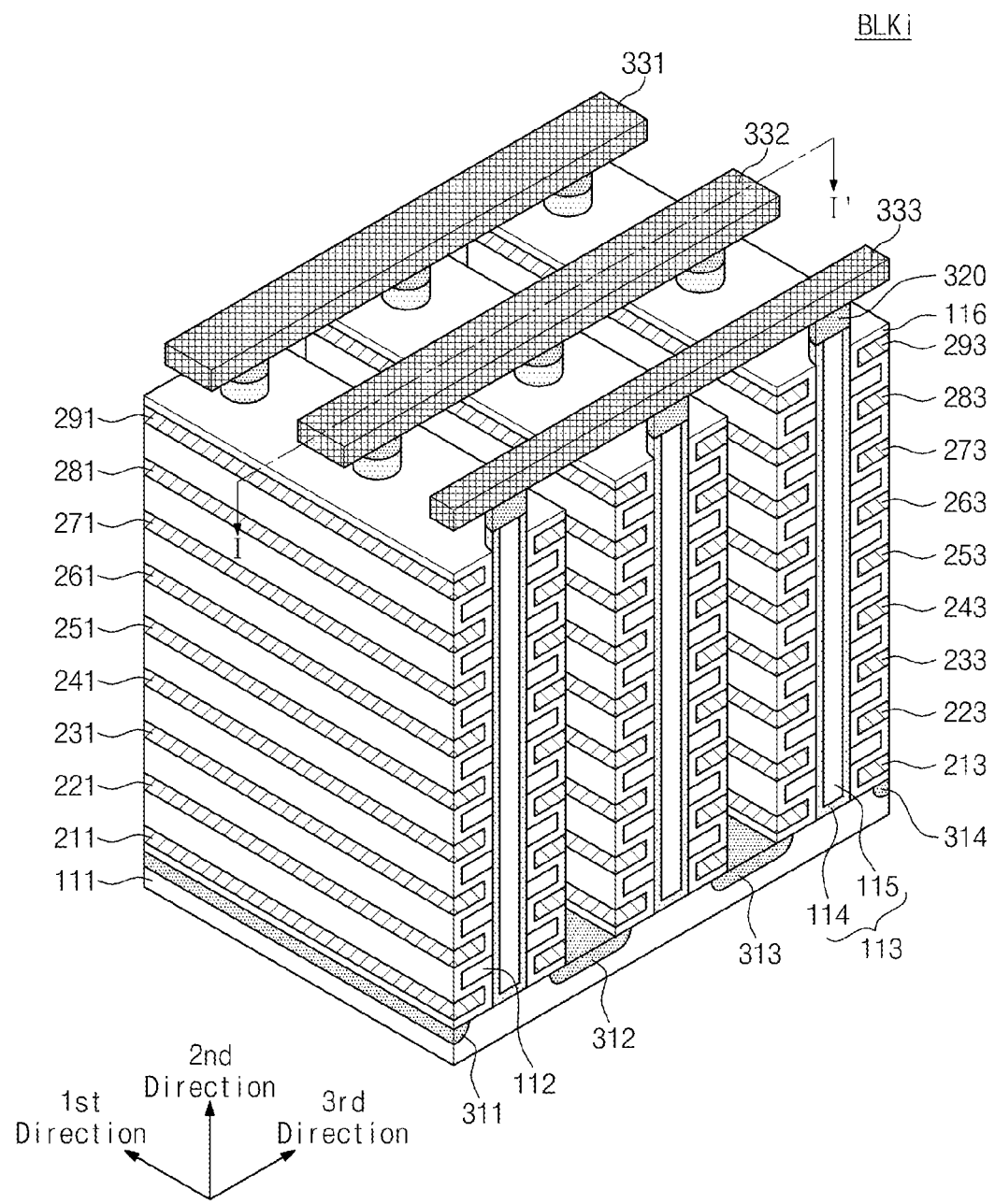
Figure 10:
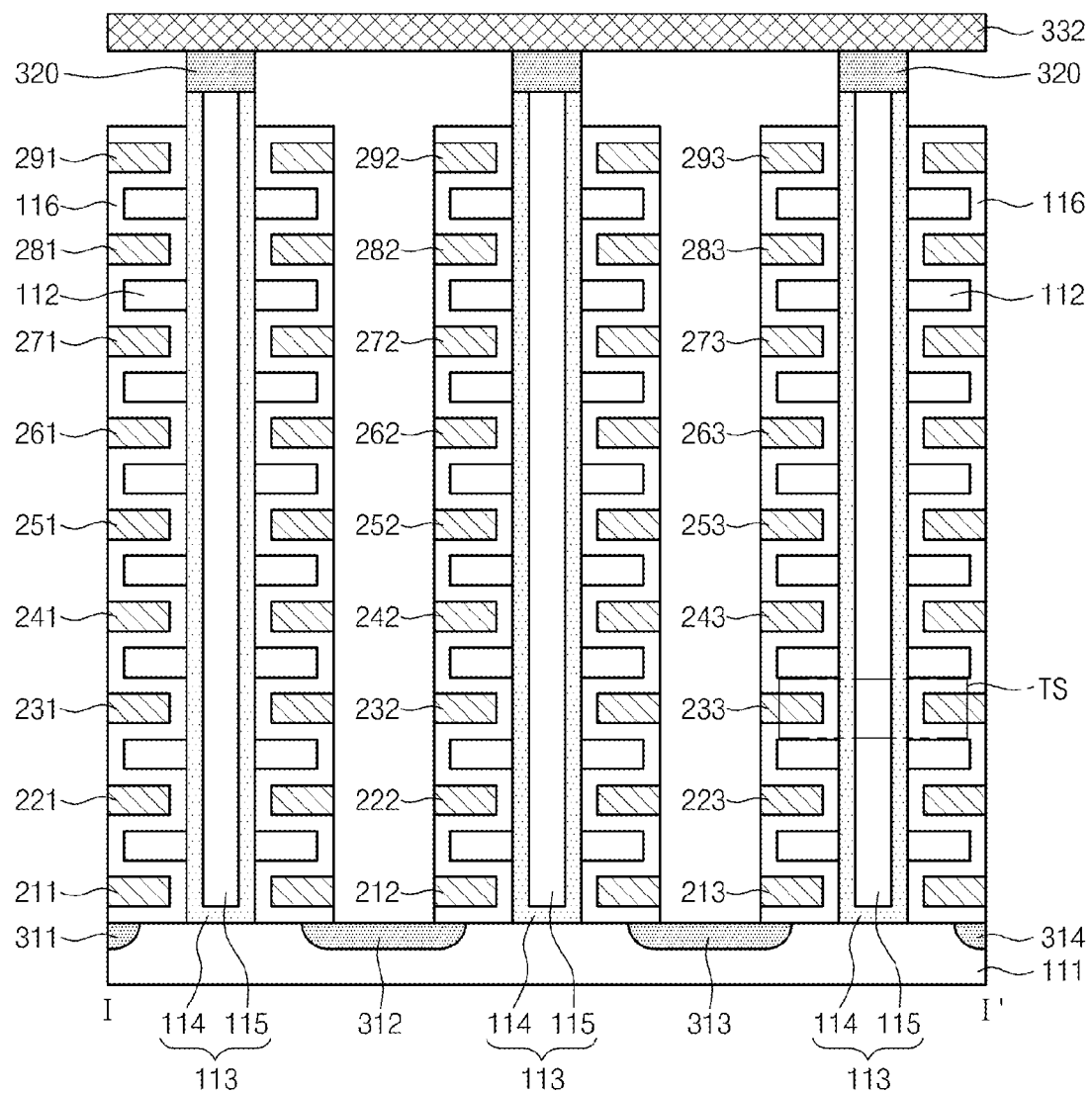

FIG. 9 is a perspective view of one memory block BLKi of FIG. 8. FIG. 10 is a cross-sectional view taken along a line I-I' of the memory block BLKi of FIG. 9. Referring to FIGS. 9 and 10, a memory block BLKi may include structures extending along first to third directions.

First, a substrate 111 may be provided. Substrate 111 may include a silicon material doped by first type impurity. For example, substrate 111 may include a silicon material doped by p-type impurity or be a p-type well (e.g., a pocket p-well). Substrate 111 may further include an n-type well surrounding the p-type well. Below, it is assumed that substrate 111 is p-type silicon. However, substrate 111 is not limited to the p-type silicon. A plurality of doping regions 311 to 314 extending along the first direction may be provided on substrate 111.

For example, the plurality of doping regions 311 to 314 may have a second type differing from that of substrate 111. For example, the plurality of doping regions 311 to 314 may be n-type. Below, it is assumed that first to fourth doping regions 311 to 314 are n-type. However, first to fourth doping regions 311 to 314 are not limited to the n-type. A plurality of insulation materials 112 extending along the first direction may be sequentially provided along the second direction over a region of substrate 111 between first and second doping regions 311 and 312. For example, plurality of insulation materials 112 may be provided along the second direction such that they are spaced apart by a predetermined or desired distance. For example, plurality of insulation materials 112 may be provided to be spaced apart from each other along the second direction. Insulation materials 112 may include an insulator such as silicon oxide.

A plurality of pillars 113 may be sequentially provided on a region of substrate 111 between first doping region 311 and second doping region 312, and may be formed to penetrate insulation materials 112 along the second direction. For example, the plurality of pillars 113 may penetrate insulation materials 112 to contact with substrate 111.

Each of pillars 113 may be composed of a plurality of materials. For instance, a surface layer 114 of each pillar 113 may include a silicon material having a first type. For example, surface layer 114 of each pillar 113 may include a silicon material which is doped with the same type as that of substrate 111. Hereinafter, it is assumed that surface layer 114 of each pillar 113 includes p-type silicon. However, surface layer 114 of each pillar 113 is not limited to include p-type silicon.

An inner layer 115 of each pillar 113 may be formed of an insulation material. For example, inner layer 115 of each pillar 113 may be filled with an insulation material such as silicon oxide.

In a region between first and second doping regions 311 and 312, an insulation layer 116 may be provided along exposed surfaces of insulation materials 112, pillars 113, and substrate 111. For example, the thickness of insulation material 116 may be less than a half of the distance between insulation materials 112. That is, a region, in which any material other than insulation materials 112 and insulation layer 116 is disposed, may be provided between insulation layer 116 provided on an undersurface of the first insulation material of insulation materials 112 and insulation layer 116 provided on a top surface of the second insulation material under the first insulation material.

In the region between first and second doping regions 311 and 312, conductive materials 211 to 291 may be provided on an exposed surface of insulation layer 116. For example, conductive material 211 extending along the first direction may be provided between substrate 111 and insulation layer 112 adjacent thereto. More specifically, conductive material 211 extending along the first direction may be provided between substrate 111 and insulation layer 116 disposed under insulation material 112 adjacent to substrate 111.

A conductive material extending along the first direction may be provided between insulation layer 116 on a top surface of a specific insulation material among insulation materials 112 and insulation layer 116 disposed on an undersurface of an insulation layer provided on a top of the specific insulation material. Also, conductive material 291 extending along the first direction may be provided on insulation materials 112. For example, conductive materials 211 to 291 extending along the first direction may be a metallic material.

For example, conductive materials 211 to 291 extending along the first direction may be a conductive material such as polysilicon.

A structure identical to a structure disposed on first and second doping regions 311 and 312 may be provided in a region between second and third doping regions 312 and 313. For example, the plurality of insulation materials 112 extending along the first direction, the plurality of pillars 113 which are sequentially arranged in the first direction and penetrate the plurality of insulation materials 113 in the third direction, insulation layer 116 provided on exposed surfaces of the plurality of insulation materials 112 and the plurality of pillars 112, and the plurality of conductive materials 212 to 292 extending along the first direction may be provided in the region between second and third doping regions 312 and 313.

A structure identical to a structure disposed on first and second doping regions 311 and 312 may be provided in a region between third and fourth doping regions 313 and 314. For example, the plurality of insulation materials 112 extending along the first direction, the plurality of pillars 113 which are sequentially arranged in the first direction and penetrate the plurality of insulation materials 113 in the third direction, insulation layer 116 provided on exposed surfaces of the plurality of insulation materials 112 and the plurality of pillars 112, and the plurality of conductive materials 213 to 293 extending along the first direction may be provided in the region between third and fourth doping regions 313 and 314.

Drains 320 may be respectively provided on the plurality of pillars 113. For example, drains 320 may include a silicon material doped with a second type material. For example, drains 320 may include a silicon material doped with an n-type material. Hereinafter, it is assumed that drains 320 include a silicon material doped with an n-type material. However, drains 320 are not limited to include n-type silicon materials. In example embodiments, a width of each drain 320 may be wider than that of a corresponding pillar 113. For example, each drain 320 may be provided on a top surface of the corresponding pillar 113 in a pad shape.

Conductive materials 331 to 333 extending in the third direction may be respectively connected on drains 320. Conductive materials 331 to 333 may be sequentially disposed along the first direction. Conductive materials 331 to 333 may be respectively connected to drains 320 in the corresponding region. For example, drains 320 and second conductive material 333 extending along the third direction may be connected to each other through respective contact plugs. For example, conductive materials 331 to 333 extending along the third direction may be a metallic material. For example, conductive materials 331 to 333 may be a conductive material such as polysilicon.

In FIGS. 9 and 10, each of pillars 113 may form a string together with an adjacent region of insulation layer 116 and an adjacent region of the plurality of conductive materials 211 to 291, 212 to 292, and 213 to 293. For example, each pillar 113 may form a NAND string NS together with an adjacent region to insulation layer 116 and an adjacent region of first conductive materials 211 to 291, 212 to 292, and 213 to 293 extending along the first direction. The NAND string NS may include a plurality of transistor structures TS. The transistor structure TS will be more fully described with reference to FIG. 11.

Figure 11:
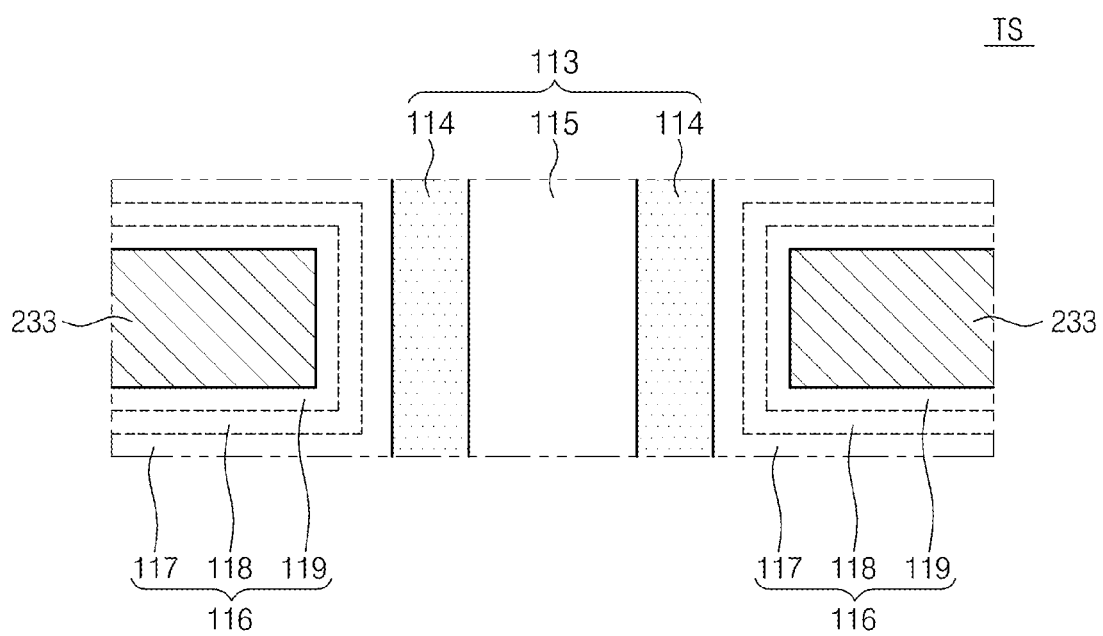

FIG. 11 is a cross-sectional view of a transistor structure TS of FIG. 10. Referring to FIGS. 9 to 11, an insulation layer 116 may include first to third sub insulation layers 117, 118 and 119.

P-type silicon 114 of a pillar 113 may act as a body. First sub insulation layer 117 adjacent to pillar 113 may act as a tunneling insulation layer. For example, first sub insulation layer 117 adjacent to pillar 113 may include a thermal oxide layer.

Second sub insulation layer 118 may act as a charge storage layer. For example, second sub insulation layer 118 may act as a charge trap layer. For example, second sub insulation layer 118 may include a nitride layer or a metal oxide layer (e.g., aluminum oxide layer, hafnium oxide layer, etc.).

Third sub insulation layer 119 adjacent to a conductive material 233 may act as a blocking insulation layer. For example, third sub insulation layer 119 adjacent to a conductive material 133 extending along a first direction may have a mono-layered or multi-layered structure. Third sub insulation layer 119 may be a high dielectric layer (e.g., aluminum oxide layer, hafnium oxide layer, etc.) having a greater dielectric constant than first and second sub insulation layers 117 and 118.

Conductive material 233 may act as a gate (or control gate). That is, gate (or control gate) 233, blocking insulation layer 119, charge trap layer 118, tunneling insulation layer 117, and body 114 may form a transistor (or memory cell transistor structure). For example, first to third sub insulation layers 117 to 119 may form an ONO structure (oxide-nitride-oxide). Hereinafter, p-type silicon 114 of pillar 113 may be defined to act as the body in the second direction.

The memory block BLKi may include a plurality of pillars 113. That is, the memory block BLKi may include a plurality of NAND strings NS. More specifically, the memory block BLKi may include a plurality of NAND strings NS extending along a second direction (or, a direction perpendicular to a substrate).

Each of the NAND strings NS may include a plurality of transistor structures TS which are stacked in a second direction. At least one of the plurality of transistor structures TS of each NAND string NS may act as a string select transistor SST. At least one of the plurality of transistor structures TS of each NAND string may act as a ground select transistor GST.

The gates (or control gates) may correspond to conductive materials 211 to 291, 212 to 292, and 213 to 293 extending along the first direction. That is, the gates (or control gates) may form word lines WL extending along the first direction and at least two select lines (e.g., at least one string select line SSL and at least one ground select line GSL).

Conductive materials 331 to 333 extending along the third direction may be connected to one ends of the NAND strings NS. For example, conductive materials 331 to 333 extending along the third direction may act as bit lines BL. That is, in one memory block BLKi, one bit line BL may be connected to the plurality of NAND strings.

Second type doping regions 311 to 314 extending along the first direction may be provided at the other ends of the NAND strings NS. Second type doping regions 311 to 314 extending along the first direction may act as common source lines CSL.

In summary, the memory block BLKi may include the plurality of NAND strings NS extending along a direction (second direction) perpendicular to substrate 111, and may operate as a NAND flash memory block (e.g., charge trap type) in which the plurality of NAND strings NS is connected to one bit line BL.

In FIGS. 9 to 11, it has been described that conductive materials 211 to 291, 212 to 292, and 213 to 293 extending along the first direction are provided on nine layers. However, first conductive materials 211 to 291, 212 to 292, and 213 to 293 extending along the first direction are not limited to being provided on the nine layers. For example, the conductive materials extending along the first direction may be provided upon 8, 16 or more layers. That is, a NAND string may include 8, 16 or more transistors.

In FIGS. 9 to 11, it has been described that three NAND strings NS are connected to one bit line BL. However, the inventive concept is not limited to such a case that three NAND strings NS are connected to one bit line BL. For example, in the memory block BLKi, m NAND strings NS may be connected to one bit line BL. Here, the number of conductive materials 211 to 291, 212 to 292, and 213 to 293 extending along the first direction and the number of common source lines 311 to 314 may also be adjusted so as to correspond to the number of NAND strings NS connected to one bit line BL.

In FIGS. 9 to 11, it has been described that three NAND strings NS are connected to one conductive material extending along the first direction. However, the inventive concept is not limited to such a case that three NAND strings NS are connected to a conductive material. For example, n NAND strings NS may be connected to one conductive material. Here, the number of conductive materials 331 to 333 extending along the third direction may also be adjusted to correspond to the number of NAND strings NS connected to one conductive material.

Figure 12:
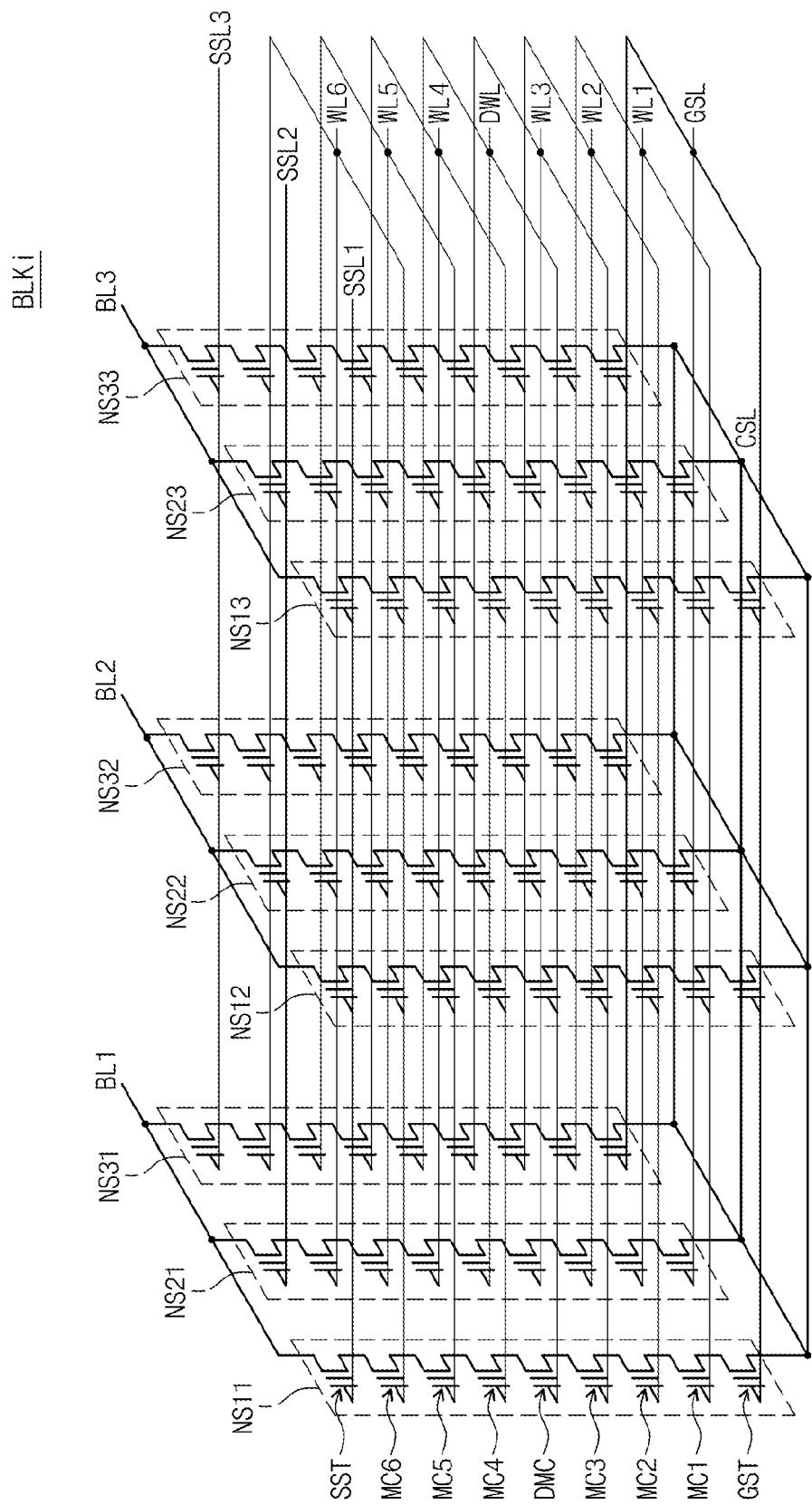

FIG. 12 is an equivalent diagram of a memory block BLKi described with reference to FIGS. 9 to 11. Referring to FIGS. 9 to 12, NAND strings NS11 to NS31 may be provided between a first bit line BL1 and a common source line CSL. NAND strings NS12, NS22 and NS32 may be provided between a second bit line BL2 and the common source line CSL. NAND strings NS13, NS23 and NS33 may be provided between a third bit line BL3 and the common source line CSL. The third bit line BL3 may correspond to a conductive material 333 extending along a third direction.

A string select transistor SST of each NAND string NS may be connected to a corresponding bit line BL. A ground select transistor GST of each NAND string NS may be connected to the common source line CSL. Memory cells MC may be provided between the string select transistor SST and the ground select transistor GST of each NAND string NS.

Hereinafter, the NAND strings NS may be defined in units of rows and columns. The NAND strings NS commonly connected to one bit line may form one column. For example, the NAND strings NS11 to NS 31 connected to the first bit line BL1 may correspond to a first column. The NAND strings NS12 to NS 32 connected to the second bit line BL2 may correspond to a second column. The NAND strings NS13 to NS 33 connected to the third bit line BL3 may correspond to a third column. The NAND strings NS connected to one string select line SSL may form one row. For example, the NAND strings NS11 to NS13 connected to a first string select line SSL1 may form a first row. The NAND strings NS21 to NS23 connected to a second string select line SSL2 may form a second row. The NAND strings NS31 to NS33 connected to a third string select line SSL3 may form a third row.

A height may be defined in each NAND string NS. For example, the height of the ground select transistor GST may be defined as 1 in each NAND string NS. In each NAND string NS, the closer to the string selection transistor SST, the higher the height of a memory cell. In each NAND string NS, the height of the memory cell MC6 adjacent to the string select transistor SST may be defined as 6.

The string select transistors SST of the NAND strings NS of the same row may share the string select line SSL. The string select transistors SST of the NAND strings NS in different rows may be connected with different string select lines SSL1, SSL2, and SSL3, respectively.

The memory cells MC having the same height in the NAND strings NS of the same row may share the word line WL. The word lines WL of the NAND strings NS which have the same height and correspond to different rows may be commonly connected. Dummy memory cells DMC having the same height in the NAND strings NS of the same row may share a dummy word line DWL. The dummy word lines DWL of the NAND strings NS which have the same height and are connected to dummy memory cells DMC of the NAND strings NS in different rows may be commonly connected.

For example, the word lines WL or the dummy word lines DWL may be commonly connected on layers where conductive materials 211 to 291, 212 to 292, and 213 to 293 extending in the first direction are provided. For example, conductive materials 211 to 291, 212 to 292, and 213 to 293 extending in the first direction may be connected to an upper layer via a contact. Conductive materials 211 to 291, 212 to 292, and 213 to 293 extending in the first direction may be connected in common at the upper layer. Ground select transistors GST of the NAND strings NS of the same row may share a ground select line GSL. The ground select transistors GST of the NAND strings NS in different rows may share the ground select line GSL. That is, the NAND strings NS11 to NS13, NS21 to NS23, and NS31 to NS33 may be connected in common to the ground select line GSL.

The common source line CSL may be commonly connected to all the NAND strings NS. For example, first to fourth doping regions 311 to 314 may be connected at an active region of substrate 111. For example, first to fourth doping regions 311 to 314 may be connected to an upper layer via a contact. The first to fourth doping regions 311 to 314 may be connected in common at the upper layer.

As illustrated in FIG. 12, the word lines WL having the same height may be commonly connected. Therefore, when the word line WL with a specific height is selected, all of the NAND strings NS connected to the selected word line WL may be selected. The NAND strings NS of different rows may be connected to different string select lines SSL. Accordingly, among the NAND strings NS connected to the same word line WL, the NAND strings NS of the unselected row may be electrically isolated from the bit lines BL1 to BL3. That is, a row of the NAND strings NS may be selected by selecting the string select lines SSL1 to SSL3. The NAND strings NS of the selected row may be selected by the column unit by selecting the bit lines BL1 to BL3.

In each NAND string NS, a dummy memory cell DMC may be provided. The first to third memory cells MC1 to MC3 may be provided between the dummy memory cell DMC and the ground select transistor GST. The fourth to sixth memory cells MC4 to MC6 may be provided between the dummy memory cell DMC and the string select transistor SST. Below, it is assumed that the memory cells MC in each NAND string NS are divided into memory cell groups by the dummy memory cell DMC. Memory cells (e.g., MC1 to MC3), adjacent to the ground select transistor GST, from among the divided memory cell groups may be referred to as a lower memory cell group. Memory cells (e.g., MC4 to MC6), adjacent to the string select transistor SST, from among the divided memory cell groups may be referred to as an upper memory cell group.

Referring to FIGS. 8 to 12, a first hard decision read operation may be performed by applying a first voltage to a first word line connected with memory cells arranged in a direction perpendicular to a substrate. A result of the first hard decision read operation may be stored at a first latch. A second hard decision read operation may be performed by applying a second voltage greater than the first voltage sequentially. A first soft decision value may be formed using the result of the first hard decision read operation stored at the first latch, without applying of a first soft decision read voltage.

Figure 13:
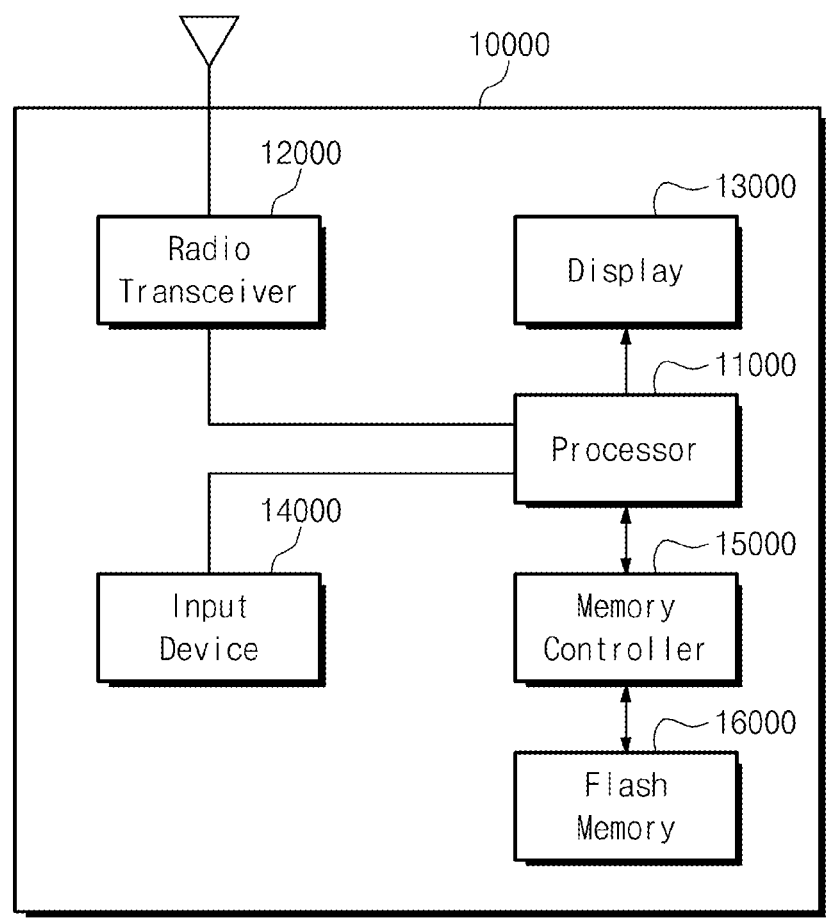
FIG. 13 is a block diagram schematically illustrating an electronic device including a memory controller and a non-volatile memory device according to an embodiment of the inventive concept.

FIG. 13 is a block diagram schematically illustrating an electronic device 10000 including a memory controller 15000 and a non-volatile memory device 16000 according to an embodiment of the inventive concept.

Referring to FIG. 13, an electronic device 10000 such as a cellular phone, a smart phone, or a tablet PC may include a non-volatile memory device 16000 implemented by a flash memory device and a memory controller 15000 to control non-volatile memory device 16000.

Memory controller 15000 may be controlled by a processor 11000 which controls an overall operation of electronic device 10000.

Data stored at non-volatile memory device 16000 may be displayed through a display 13000 according to a control of memory controller 15000 which operates according to a control of processor 11000.

A radio transceiver 12000 may change a radio signal through an antenna. For example, radio transceiver 12000 may convert a radio signal received through the antenna into a signal capable of being processed by processor 11000. Thus, processor 11000 may process a signal from radio transceiver 12000, and may store the processed signal at non-volatile memory device 16000. Or, processor 11000 may display the processed signal through display 13000.

Radio transceiver 12000 may convert a signal from processor 11000 into a radio signal, and may output the converted radio signal to the exterior through the antenna.

An input device 14000 may be a device that receives a control signal for controlling an operation of processor 11000 or data to be processed by processor 11000, and may be implemented by a pointing device such as a touch pad or a computer mouse, a key pad, or a keyboard.

Processor 11000 may control display 13000 such that data from non-volatile memory device 16000, a radio signal from radio transceiver 12000 or data from input device 14000 is displayed through display 13000.

Figure 14:
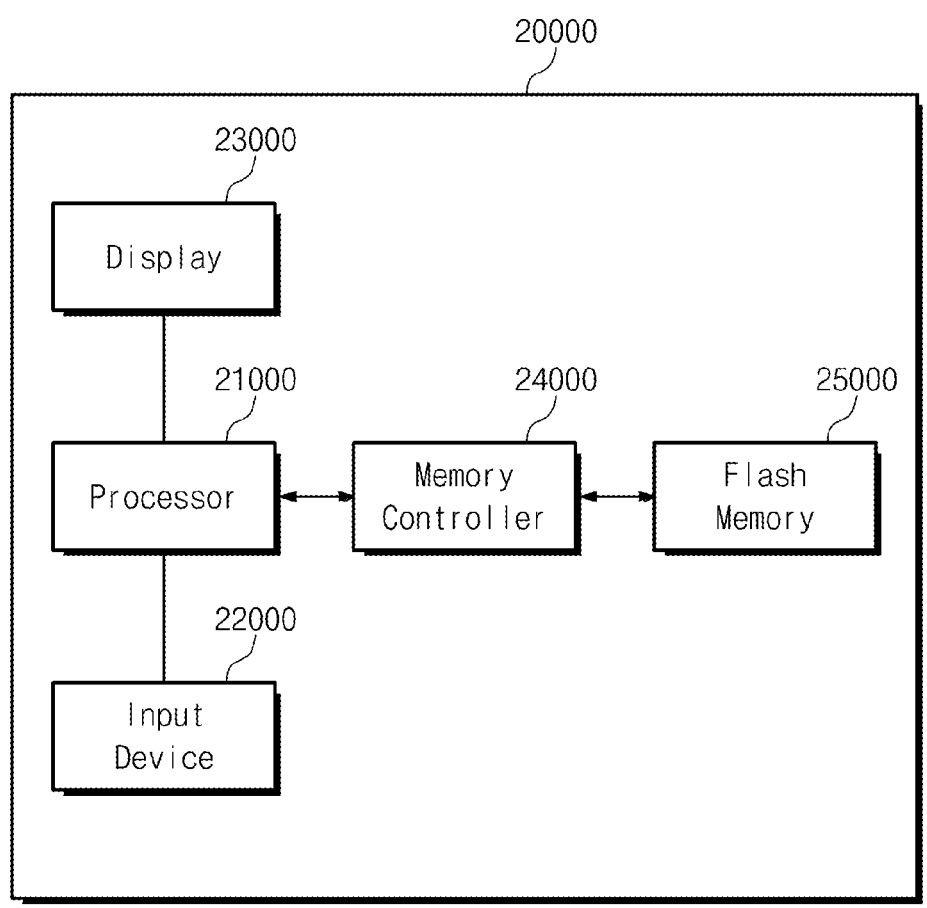
FIG. 14 is a block diagram schematically illustrating an electronic device including a memory controller and a non-volatile memory device according to another embodiment of the inventive concept.

FIG. 14 is a block diagram schematically illustrating an electronic device 20000 including a memory controller 24000 and a non-volatile memory device 25000 according to another embodiment of the inventive concept.

Referring to FIG. 14, an electronic device 20000 may be implemented by a data processing device such as a personal computer, a tablet computer, a net-book, an e-reader, a PDA (Personal Digital Assistant), a PMP (Portable Multimedia Player), an MP3 player, or an MP4 player, and may include a non-volatile memory device 25000 (e.g., a flash memory device) and a memory controller 24000 to control an operation of non-volatile memory device 25000.

Non-volatile memory device 25000 may mean a flash memory device illustrated in FIGS. 2 and 3. Non-volatile memory device 25000 may store random data.

Electronic device 20000 may include a processor 21000 to control an overall operation of electronic device 20000. Memory controller 24000 may be controlled by processor 21000.

Processor 21000 may display data stored at non-volatile memory device 25000 through a display 23000 according to an input signal generated by an input device 22000. For example, input device 22000 may be implemented by a pointing device such as a touch pad or a computer mouse, a key pad, or a keyboard.

Figure 15:
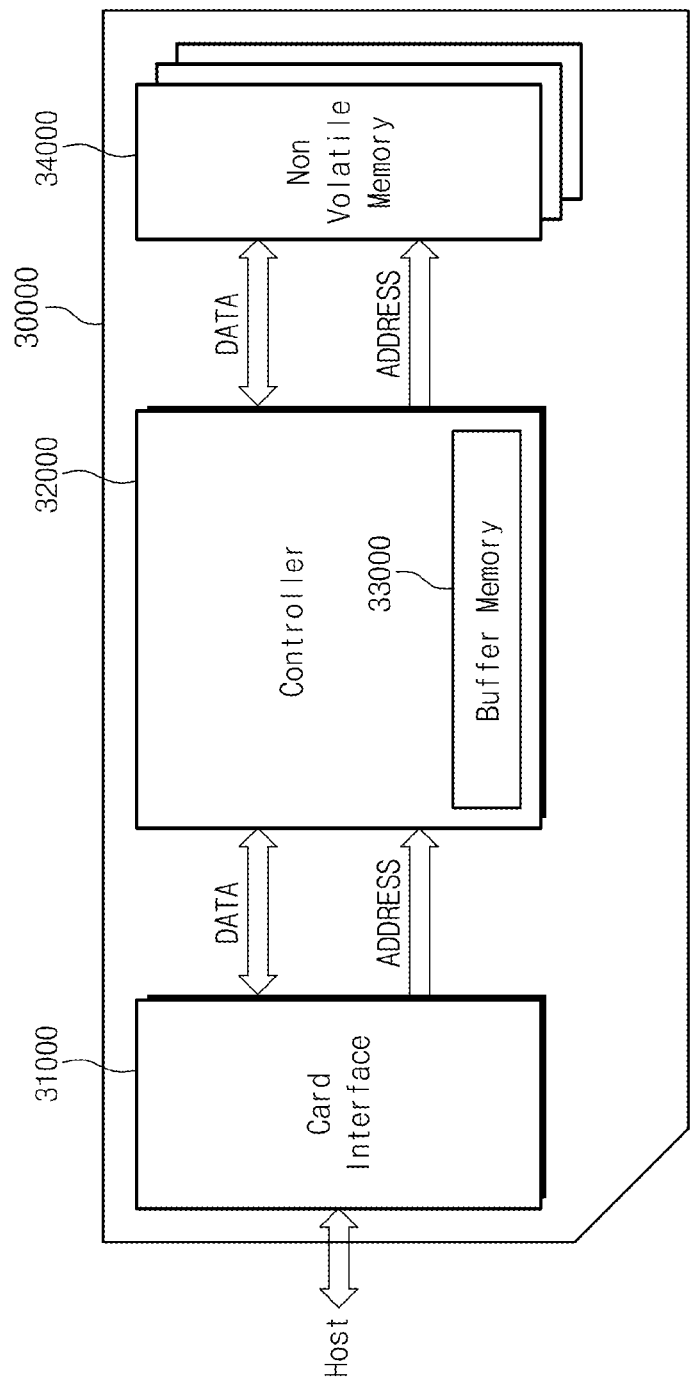
FIG. 15 is a block diagram schematically illustrating an electronic device including a non-volatile memory device according to still another embodiment of the inventive concept.

FIG. 15 is a block diagram schematically illustrating an electronic device 30000 including a non-volatile memory device 34000 according to still another embodiment of the inventive concept. Referring to FIG. 15, an electronic device 30000 may include a card interface 31000, a memory controller 32000, and a non-volatile memory device 34000 (e.g., a flash memory device).

Electronic device 30000 may exchange data with a host through card interface 31000. Card interface 31000 may be an SD (Secure Digital) card interface or an MMC (Multi-Media Card) interface. However, the inventive concept is not limited thereto. Card interface 31000 may interface data exchange between host and memory controller 32000 according to the communications protocol of the host capable of communicating electronic device 30000.

Memory controller 32000 may control an overall operation of electronic device 30000, and may control exchange of data between card interface 31000 and non-volatile memory device 34000. A buffer memory 33000 of memory controller 32000 may buffer data transferred between card interface 31000 and non-volatile memory device 34000.

Memory controller 32000 may be connected with card interface 31000 and non-volatile memory device 34000 through a data bus DATA and an address bus ADDRESS. According to an embodiment, memory controller 32000 may receive an address of data to be read or written from card interface 31000 through the address bus ADDRESS, and may send it to non-volatile memory device 34000.

Also, memory controller 32000 may receive or transfer data to be read or written through the data bus DATA connected with card interface 31000 or non-volatile memory device 34000. Non-volatile memory device 34000 may mean a flash memory device illustrated in FIGS. 2 and 3. Non-volatile memory device 34000 may store random data.

When electronic device 30000 is connected with a host such as a PC, a tablet PC, a digital camera, a digital audio player, a mobile phone, console video game hardware or a digital set-top box, the host may exchange data stored at non-volatile memory device 34000 through card interface 31000 and memory controller 32000.

Figure 16:
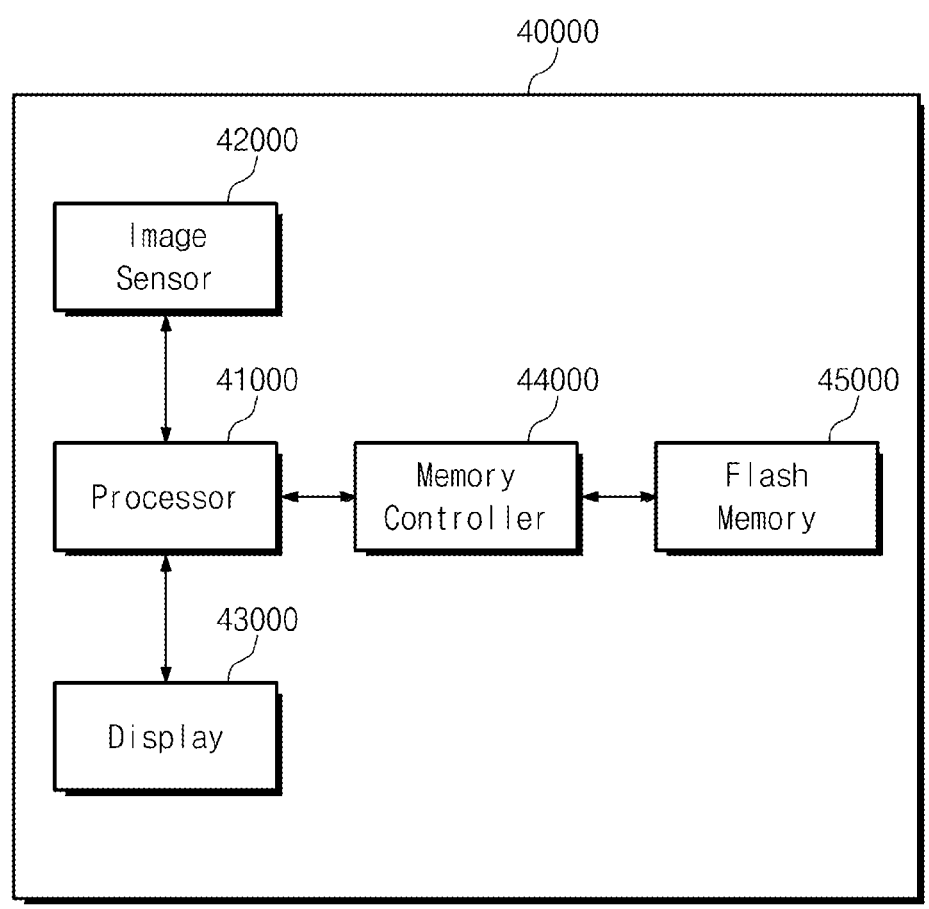
FIG. 16 is a block diagram schematically illustrating an electronic device including a memory controller and a nonvolatile memory device according to still another embodiment of the inventive concept.

FIG. 16 is a block diagram schematically illustrating an electronic device including a memory controller and a non-volatile memory device according to still another embodiment of the inventive concept. Referring to FIG. 16, an electronic device 40000 may include a non-volatile memory device 45000 (e.g., a flash memory device), a memory controller 44000 to control a data processing operation of non-volatile memory device 45000, and a processor 41000 to control an overall operation of electronic device 40000. Non-volatile memory device 45000 may mean a flash memory device illustrated in FIGS. 2 and 3.

An image sensor 42000 of electronic device 40000 may convert an optical signal into a digital signal, and the converted digital signal may be stored at non-volatile memory device 45000 under the control of processor 41000. Or, the converted digital signal may be displayed through a display 43000 under the control of processor 41000.

Figure 17:
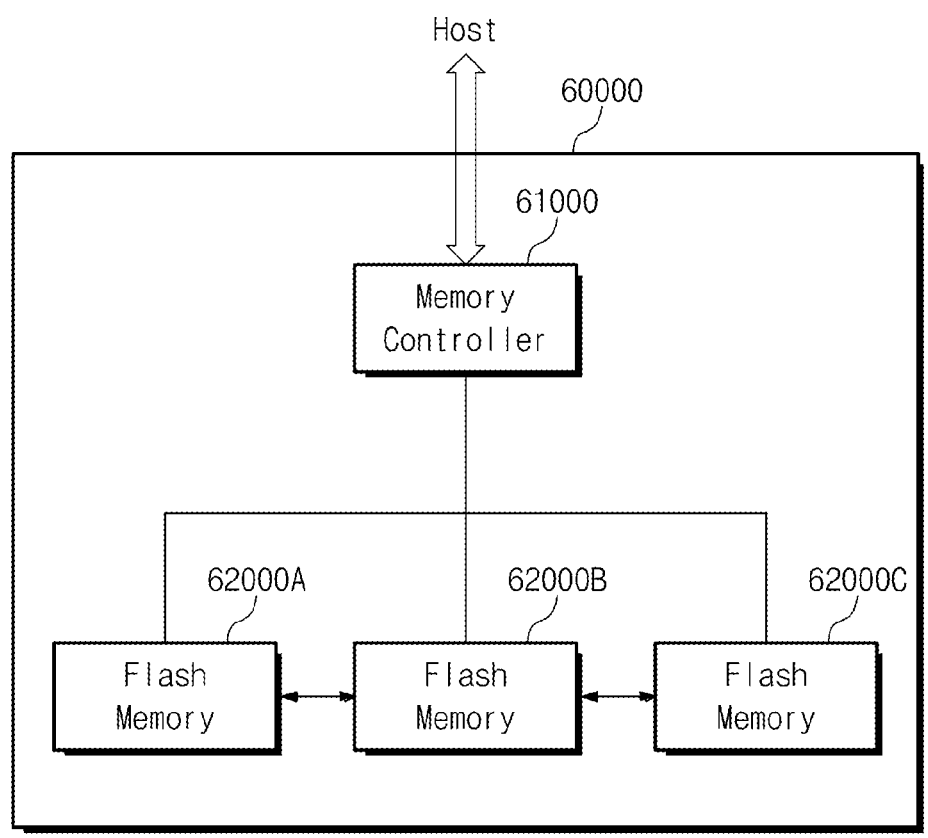
FIG. 17 is a block diagram schematically illustrating an electronic device including a memory controller and nonvolatile memory devices according to still another embodiment of the inventive concept.

FIG. 17 is a block diagram schematically illustrating an electronic device 60000 including a memory controller 61000 and non-volatile memory devices 62000A, 62000B, and 62000C according to still another embodiment of the inventive concept. Referring to FIG. 17, an electronic device 60000 may be implemented by a data storage device such as a solid state drive (SSD).

Electronic device 60000 may include non-volatile memory devices 62000A, 62000B, and 62000C and a memory controller 61000 to control a data processing operation of each of non-volatile memory devices 62000A, 62000B, and 62000C.

Electronic device 60000 may be implemented by a memory system or a memory module. Each of non-volatile memory devices 62000A, 62000B, and 62000C may mean a flash memory device illustrated in FIGS. 2 and 3. Non-volatile memory devices 62000A, 62000B, and 62000C may store random data. Memory controller 61000 may be implemented outside or inside electronic device 60000 according to an embodiment.

Figure 18:
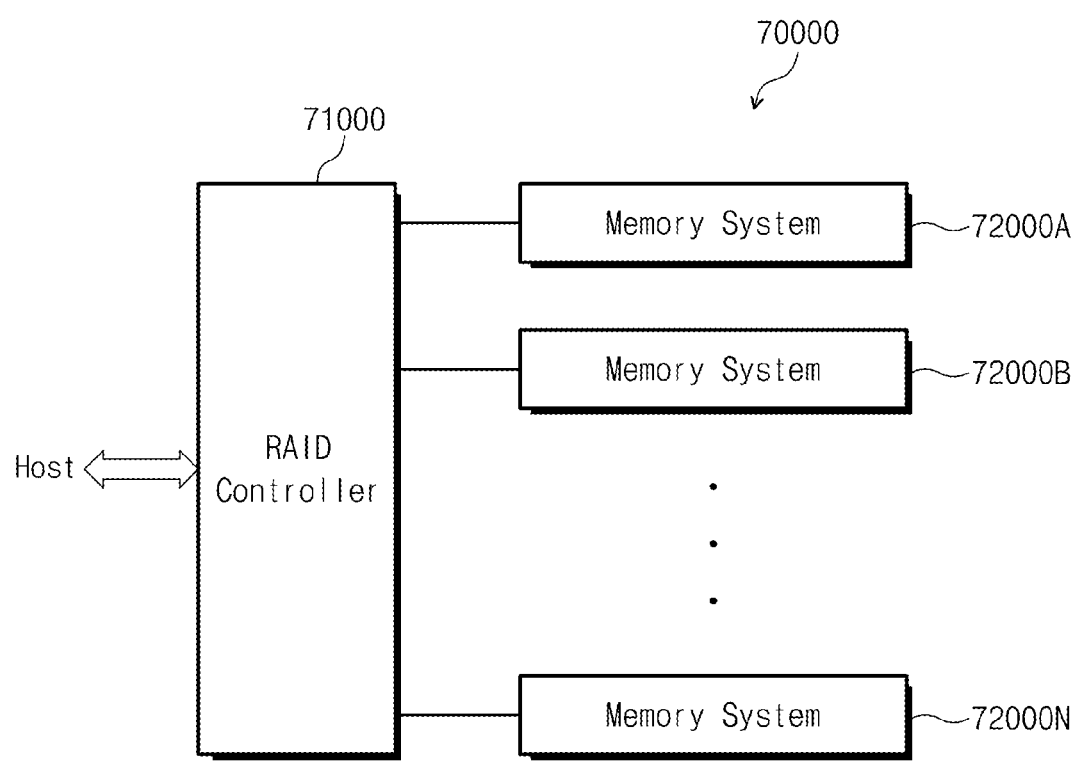
FIG. 18 is a block diagram of a data processing system including an electronic device illustrated in FIG. 17.

FIG. 18 is a block diagram of a data processing system including an electronic device illustrated in FIG. 17. Referring to FIGS. 17 and 18, a data storage device 70000 may be implemented by a RAID (Redundant Array of Independent Disks) system. Data storage device 70000 may include a RAID controller 71000 and a plurality of memory systems 72000A to 72000N (N being a natural number).

Each of memory systems 72000A to 72000N may be an electronic device in FIG. 16. Memory systems 72000A to 72000N may form an RAID array. Data storage device 70000 may be implemented by a personal computer or an SSD.

During a program operation, RAID controller 71000 may output program data output from a host to one of memory systems 72000A to 72000N according to one selected from a plurality of RAID levels based on RAID level information output from the host.

During a read operation, RAID controller 71000 may transfer data read from one of memory systems 72000A to 72000N to the host according to one selected from a plurality of RAID levels based on RAID level information output from the host.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of operating a non-volatile memory device, the method comprising:
    employing a voltage generator to apply first and second read voltages to a first word line of the memory device to perform a read operation;
    counting first memory cells of the memory device each having a threshold voltage belonging to a first voltage range between the first read voltage and the second read voltage;
    employing the voltage generator to apply a third read voltage to the first word line sequentially after applying the second read voltage to count second memory cells of the memory device each having a threshold voltage belonging to a second voltage range between the second read voltage and the third read voltage;
    comparing a number of the first memory cells counted and a number of the second memory cells counted;
    determining a fourth read voltage based on a result of the comparing; and
    employing the voltage generator to apply the fourth read voltage to the first word line sequentially after applying the third read voltage.

2. The method of claim 1, wherein when the number of the second memory cells is less than the number of the first memory cells, the fourth read voltage is determined to be less than the third read voltage.

3. The method of claim 1, further comprising:
    employing the voltage generator to apply a fifth read voltage, less than the fourth read voltage, to the first word line after applying of the fourth read voltage.

4. The method of claim 3, further comprising:
employing the voltage generator to apply a sixth read voltage, less than the fifth read voltage, to the first word line after applying of the fifth read voltage.

5. The method of claim 1, wherein when the number of the second memory cells is more than the number of the first memory cells, the fourth read voltage is determined to be greater than the third read voltage.

6. The method of claim 5, further comprising:
employing the voltage generator to apply a fifth read voltage, greater than the fourth read voltage, to the first word line after applying of the fourth read voltage.

7. The method of claim 6, further comprising:
employing the voltage generator to apply a sixth read voltage, greater than the fifth read voltage, to the first word line after applying of the fifth read voltage.

8. A method of controlling a memory device, the method comprising:
counting first memory cells of the memory device each having a threshold voltage belonging to a first voltage range between a first read voltage and a second read voltage;
counting second memory cells of the memory device each having a threshold voltage belonging to a second voltage range between the second read voltage and a third read voltage;
comparing a number of the first memory cells counted and a number of the second memory cells counted; and
determining a fourth read voltage to be applied to memory cells of the memory device sequentially after the third read voltage based on a comparison result.

9. The method of claim 8, wherein when the number of the second memory cells is less than the number of the first memory cells, the fourth read voltage is determined to be less than the third read voltage.

10. The method of claim 9,
wherein when the fourth read voltage is determined to be less than the third read voltage, a fifth read voltage to be applied sequentially after the fourth read voltage is determined to be less than the fourth read voltage.

11. The method of claim 8, wherein when the number of the second memory cells is more than the number of the first memory cells, the fourth read voltage is determined to be greater than the third read voltage.

12. The method of claim 11, wherein if the fourth read voltage is determined to be greater than the third read voltage, a fifth read voltage to be applied sequentially after the fourth read voltage is determined to be greater than the fourth read voltage.

13. The method of claim 8, wherein the number of the first memory cells is counted by performing a logical operation on a read result by using the first read voltage and a read result by using the second read voltage.

14. A method, comprising: counting first memory cells of a memory device each having a threshold voltage belonging to a first voltage range between a first read voltage and a second read voltage;
counting second memory cells of the memory device each having a threshold voltage belonging to a second voltage range between the second read voltage and a third read voltage;
comparing a number of the first memory cells counted and a number of the second memory cells counted to produce a comparison result; and
determining, based on the comparison result, a third voltage range for counting memory cells of the memory device having a threshold voltage belonging to the third voltage range.

15. The method of claim 14, wherein when the third read voltage is less than the first read voltage and the number of the second memory cells is less than the number of the first memory cells, then the third voltage range is determined to span a set of voltages which are less than the second read voltage, and when the third read voltage is less than the first read voltage and the number of the second memory cells is greater than the number of the first memory cells, then the third voltage range is determined to span a set of voltages which are greater than the second read voltage.

16. The method of claim 14, wherein when the third read voltage is greater than the first read voltage and the number of the second memory cells is less than the number of the first memory cells, then the third voltage range is determined to span a set of voltages which are greater than the second read voltage, and when the third read voltage is greater than the first read voltage and the number of the second memory cells is greater than the number of the first memory cells, then the third voltage range is determined to span a set of voltages which are less than the second read voltage.

17. The method of claim 14, wherein the counting the first memory cells each having a threshold voltage belonging to the first voltage range between the first read voltage and the second read voltage comprises:
employing a voltage generator to apply the first read voltage to the memory cells and reading first data values from each of the memory cells;
employing a voltage generator to apply the second read voltage to the memory cells and reading second data values from each of the memory cells;
exclusive OR-ing the first data values and the second data values to produce an output indicating whether threshold voltages of each of the memory cells are between the first read voltage and the second read voltage.

18. The method of claim 14, further comprising finding a valley in a threshold voltage distribution of the memory cells by iteratively changing voltage ranges and counting numbers of memory cells each having a threshold voltage belonging to each of the changed voltage ranges.

* * * * *